United States Patent
Weyant et al.

(10) Patent No.: US 11,882,673 B1
(45) Date of Patent: Jan. 23, 2024

(54) HEAT SPREADER HAVING CONDUCTION ENHANCEMENT WITH EMI SHIELDING

(71) Applicant: ADVANCED COOLING TECHNOLOGIES, INC., Lancaster, PA (US)

(72) Inventors: Jens Weyant, Lancaster, PA (US); Conor Maghan, Lancaster, PA (US); Matt Schultz, Lancaster, PA (US); Ryan Spangler, Lancaster, PA (US)

(73) Assignee: Advanced Cooling Technologies, Inc., Lancaster, PA (US)

( * ) Notice: Subject to any disclaimer, the term of this patent is extended or adjusted under 35 U.S.C. 154(b) by 16 days.

(21) Appl. No.: 17/104,346

(22) Filed: Nov. 25, 2020

(51) Int. Cl.
*H05K 7/20* (2006.01)
*H05K 9/00* (2006.01)

(52) U.S. Cl.
CPC ....... *H05K 7/20418* (2013.01); *H05K 9/0049* (2013.01); *H05K 9/0088* (2013.01); *H05K 7/20336* (2013.01)

(58) Field of Classification Search
CPC .......... H05K 7/20336; H05K 7/20409; H05K 7/20418; H05K 7/20427; H05K 9/0049; H05K 9/0088
See application file for complete search history.

(56) References Cited

U.S. PATENT DOCUMENTS

| | | | |
|---|---|---|---|
| 6,717,799 B2 | 4/2004 | Hamano et al. | |
| 8,809,697 B2 | 8/2014 | Nicol et al. | |
| 2007/0295496 A1* | 12/2007 | Hall | H01L 23/3733 257/E23.105 |
| 2012/0281360 A1* | 11/2012 | Nicol | G16H 20/13 29/825 |
| 2015/0023059 A1* | 1/2015 | Lo | G02B 6/0033 362/611 |
| 2015/0090434 A1* | 4/2015 | Lemak | H01L 23/3733 427/404 |
| 2015/0382509 A1* | 12/2015 | Nagata | H01L 23/3733 361/710 |
| 2016/0154193 A1* | 6/2016 | Brukilacchio | G02B 19/0066 385/33 |
| 2017/0163302 A1 | 6/2017 | Saeidi et al. | |
| 2018/0163063 A1* | 6/2018 | Gao | C09D 163/00 |
| 2018/0331009 A1* | 11/2018 | Wang | H01L 23/66 |
| 2019/0098743 A1* | 3/2019 | Molla | H01L 23/3736 |
| 2021/0217683 A1* | 7/2021 | Bonicatto | H01L 23/42 |

* cited by examiner

*Primary Examiner* — Jacob R Crum
(74) *Attorney, Agent, or Firm* — McNees Wallace & Nurick

(57) ABSTRACT

A heat spreader including a body having a first conduction value and a first electromagnetic interference shield value. The heat spreader further includes a conduction enhancement affixed to the body, the conduction enhancement having a second conduction value greater than the first conduction value and a second electromagnetic interference shield value less than the first electromagnetic interference shield value. At least a portion of the conduction enhancement is positioned relative to the body for increasing an effective electromagnetic interference shield value of the body associated with the at least a portion of the conduction enhancement.

16 Claims, 7 Drawing Sheets

HEAT SPREADER HAVING CONDUCTION ENHANCEMENT WITH EMI SHIELDING

FIELD OF THE INVENTION

The present invention is directed to heat spreaders having a conduction enhancement.

BACKGROUND OF THE INVENTION

All electronic devices produce waste heat. Thermal management solutions are critical for ensuring that heat is effectively managed and dissipated. This ensures that devices stay within safe operating temperatures, limits failure or deteriorated performance, and increases reliability. Improving heat management also improves efficiency and enables higher power density.

Many electronics rely on conduction to spread heat from small heat producing components so that it can be more easily dissipated though a larger surface area by convection and/or radiation. Typically, electronics are mounted to a metal plate, card, or baseplate to achieve this spreading by conduction. Although metals have much higher thermal conductivities compared to other materials, capabilities of electronics are frequently limited by the heat spreading ability of metal alone. To achieve increased efficiency, higher power density, etc., of electronics, conduction enhancements can be used to increase the heat spreading ability of the metal plate, card, or baseplate, without adding additional volume to the part. Some conduction enhancements include heat pipes, vapor chambers, and materials with a higher thermal conductivity than the base material.

Electromagnetic interference (EMI) is a disturbance that affects electrical circuits, created by electromagnetic fields from another electronic device. This disturbance can prevent electronic circuits from functioning as intended. EMI shielding, the concept of using a material with the sole purpose of absorbing the electromagnetic interference, can help solve this problem in two ways. EMI shielding can be used around an electronic system to protect the system from external EMI, and/or to prevent a signal from leaking out and interfering with other electronics.

When conduction enhancements are installed into a heat spreader, such as heat pipes or vapor chambers, they replace metal that could be necessary for EMI shielding. Heat spreaders that require both conduction enhancement and EMI shielding can restrict the routing of conduction enhancements, either inside or outside the EMI shielded area. Using this method, the EMI shielding can be kept intact, but the thermal performance of the assembly is limited due to restrictions on conduction enhancement placement.

Metals have higher thermal and electrical conductivities than other materials, making them good candidates for heat spreaders as well as EMI shields. To spread heat by conduction, metals and alloys with the highest thermal conductivities are used. The most commonly used metal alloy in industry for heat spreading is Aluminum 6061. Other alloys with higher thermal conductivities are available, but are less common and can be more costly and time consuming to obtain, all for only a relatively small increase in thermal conductivity. The same disadvantages are also true for other metals. Copper C110, however, is also commonly used in industry for thermal applications. Copper has a significantly higher thermal conductivity than Aluminum 6061, but is more than three times as dense. This additional density often means too much added weight over Aluminum for an assembly, especially an airborne assembly.

It is advantageous to also use the metal in the heat spreader to form an EMI shield. This is commonly done by cutting pockets into the heat spreader for receiving electrical components. The electrically conductive metal can provide EMI shielding to the top and part or all of the sides of a component. If the shape or structure of this pocket is disturbed, electromagnetic waves could leak out. Conduction enhancements often work best when positioned directly vertically above an electrical component. For non-metallic enhancements, the maximum benefit of the conduction enhancement cannot be achieved since it would remove metal that would prevent the EMI leak.

Another common method of EMI shielding is through the use of standard EMI gaskets. The typical materials used for this purpose can shield EMI while being more flexible than metal. The disadvantage of EMI gaskets is that they have much lower thermal conductivities than metal, which could decrease the thermal performance of a heat spreader.

There is a need for heat spreaders that provide EMI shielding, without suffering from the afore-mentioned shortcomings.

SUMMARY OF THE INVENTION

Metals alone used in heat spreaders can provide some heat spreading as well as EMI shielding for the attached electronics. As the need for more efficient and/or more power dense electronics continuously escalates, the ability to spread the increasing heat using metal alone becomes an increasingly limiting factor. To keep up with the demand for more advanced electronics, conduction enhancements are needed. Common conduction enhancements, such as heat pipes, vapor chambers, and inserts, can improve the thermal performance of heat spreaders. However, upon installation, conduction enhancements replace metal that is needed for the EMI shielding of the electronics.

A solution to these problems comes in the form of conduction enhancement installation features. These installation features include an attachment material or a device, each with or without an insert or body. The proposed inventions provide a solution to both the thermal limitations of metal by using conduction enhancements and the EMI leak created from current methods of conduction enhancement installation by utilizing an additional material or a device, each to shield EMI. These inventions can be used to remove restrictions on conduction enhancement routing to improve or optimize the thermal performance of an assembly.

In one embodiment, a heat spreader including a body having a first conduction value and a first electromagnetic interference shield value. The heat spreader further includes a conduction enhancement affixed to the body, the conduction enhancement having a second conduction value greater than the first conduction value and a second electromagnetic interference shield value less than the first electromagnetic interference shield value. At least a portion of the conduction enhancement is positioned relative to the body for increasing an effective electromagnetic interference shield value of the body associated with the at least a portion of the conduction enhancement.

In another embodiment, a heat spreader including a body having a first conduction value and a first electromagnetic interference shield value. The heat spreader further includes a conduction enhancement having a second conduction value greater than the first conduction value and a second electromagnetic interference shield value less than the first electromagnetic interference shield value. A portion of the body is removed to at least partially receive the conduction enhancement. A subportion of the removed body portion or a second body is affixed to the body, the conduction enhancement, or both the body and the conduction enhancement to at least partially be adjacent to, exterior of, obscure, extend over, or a combination thereof of the at least a portion of the conduction enhancement. The heat spreader further includes the second body having a third conduction value greater than the first conduction value and a third electromagnetic interference shield value less than the first electromagnetic interference shield value. At least a portion of the conduction enhancement is positioned relative to the body and the affixed subportion of the removed body portion or the second body for increasing an effective electromagnetic interference shield value associated with the at least a portion of the conduction enhancement.

In yet another embodiment, a method for constructing a heat spreader including providing a body having a first conduction value and a first electromagnetic interference shield value, and providing a conduction enhancement having a second conduction value greater than the first conduction value and a second electromagnetic interference shield value less than the first electromagnetic interference shield value. The method further includes positioning at least a portion of the conduction enhancement in contact with and relative to the body for increasing an effective electromagnetic interference shield value of the body associated with the at least a portion of the conduction enhancement.

Other features and advantages of the present invention will be apparent from the following more detailed description, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Heat spreaders of the present invention provide improved conduction performance compared to metal heat spreaders, as well as providing EMI shielding to permit electronics to function as intended in a specific application.

Figure 1:
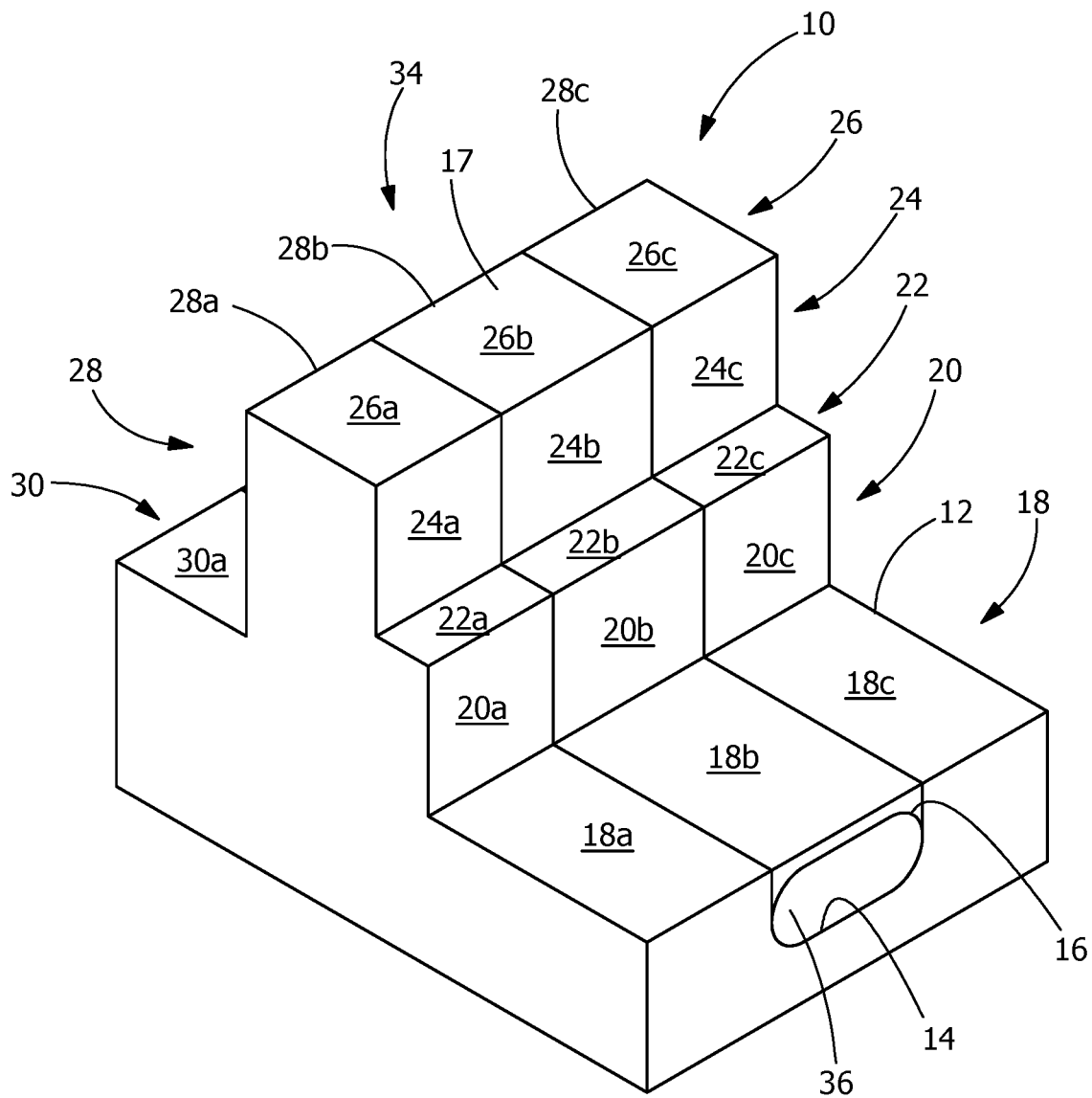
FIG. 1 is an upper perspective view of an exemplary heat spreader.
Figure 2:
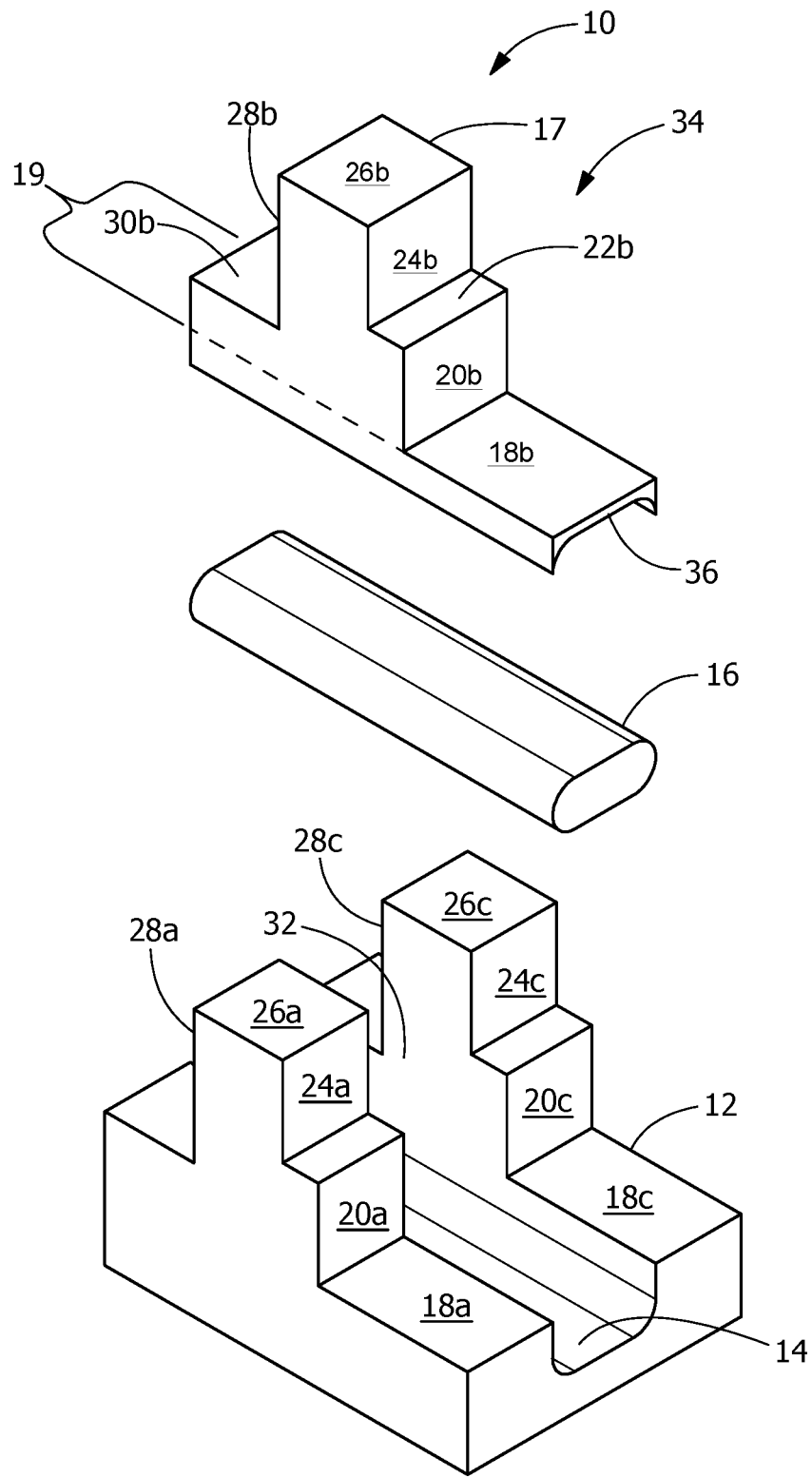
FIG. 2 is an exploded view of the heat spreader of FIG. 1.

As shown in FIGS. 1-2, heat spreader 10 may be in the form commonly referred to as a high conductivity or HiK™ plate, a vapor chamber, a graphite heat spreader encapsulated by aluminum or other material, or other type of high performance heat spreader. Heat spreader 10 includes a body 12 having a feature 14 such as a groove or channel or passageway formed therein for receiving or being placed in contact or contacting and affixed, such as with an attachment material 17, to at least a portion of a conduction enhancement 16 for increasing the amount of heat that can be removed by conduction. In one embodiment, body 12 is a metal or other suitable material having a conduction value of between 20 W/m K and 500 W/m K for metals and an EMI interference shield value that can approach, but not exceed, the value of the constituent material with the highest shielding values for a structure of the same dimensions (thickness) and same application wherein the item has been fabricated solely of the specified material. Conduction enhancement 16 such as a heat pipe, vapor chamber and inserts such as diamond and pyrolytic graphite have a conduction value of between 1,000 and 250,000 W/m K that is greater than the conduction value of body 12, with an EMI interference shield value that can approach, but not exceed, the value of the constituent material—from body 12 or attachment material 17—with the highest shielding values for a structure of the same dimensions (thickness) and same application wherein the item has been fabricated solely of the specified material. Preferably, at least a portion of the conduction enhancement 16 is positioned relative to body 12 such as in or along feature 14 for increasing an effective electromagnetic interference shield value of the body 12 associated with the portion of the conduction enhancement 16. In other words, conduction enhancement 16 and body 12 are positioned together such that conduction enhancement 16 increases, at least in close proximity to conduction enhancement 16, the effective conduction value of body 12, while also increasing, at least in close proximity to conduction enhancement 16, an effective electromagnetic interference shield value of body 12, thereby permitting electronics to operate as intended. Such an increase of the effective electromagnetic interference shield value of body 12 may be achieved as a result of at least a portion of conduction enhancement 16 being in close proximity with or adjacent to, interior of, obscured by, extends beneath, or a combination thereof relative to feature 14 of body 12. In one embodiment, depending upon the application and geometry of heat spreader, it may be possible to install a conduction enhancement 16 in contact with body 12 of a heat spreader that achieves satisfactory effective conduction values and effective electromagnetic interference shield values both in close proximity or associated with the conduction enhancement 16 and distal from or not in close proximity with the conduction enhancement 16 without removal of material from body 12.

For purposes herein, the phrase "receiving," "placed in contact," "contacting," and the like in the context of the relationship between facing contact surfaces of the body, including attachment material, and conduction enhancement is intended to mean that the components have a conformal fit such that there is essentially no air gap therebetween.

In one embodiment, such as shown in FIG. 1, heat spreader 10 includes outwardly facing surfaces 18, 20, 22, 24, 26, 28, 30 that are machined after assembly such that the corresponding surface portions 18a, 18b, 18c of surface 18, the corresponding surface portions 20a, 20b, 20c of surface 20, the corresponding surface portions 22a, 22b, 22c of surface 22, the corresponding surface portions 24a, 24b, 24c of surface 24, the corresponding surface portions 26a, 26b, 26c of surface 26, the corresponding surface portions 28a, 28b, 28c of surface 28, and the corresponding surface portions 30a, 30b (not shown in FIG. 1), 30c (not shown in FIG. 1) of surface 30 precisely match the surrounding features of one another.

In order to manufacture heat spreader 10, it is necessary to first determine the routing or path of the conduction enhancements 16 (only one conduction enhancement 16 is shown in FIGS. 1-2), which may be achieved by finite element analysis software as is known. Next, features 14 (one feature 14 is shown in FIG. 2) such as grooves or channels are formed in body 12 such as by machining or removing a portion of body 12 to receive a corresponding conduction enhancement 16 therein. That is, as shown in FIG. 2, the amount or volume of material removed from a solid block of body 12 having surfaces 18, 20, 22, 24, 26, 28, 30 entails removing the sum of the volume of body 12 corresponding to what is a portion 19 that is positioned vertically above a plane defined by surface portion 18b of what is reidentified as attachment material 17 (when added back to body 12 after assembly), as well as the volume corresponding to feature 14, which sum of removed material from body 12 being referred to as a portion or removed portion 32 of body 12. Once portion 32 of body 12 has been removed, attachment material 17 is installed to construct the heat spreader. The volume corresponding to feature 36 is subtracted from the volume of attachment material 17 in order to accommodate/receive conduction enhancement 16. The volume of feature 36 must be removed from attachment material 17 in order to receive conduction enhancement 16 between attachment material 17 and the remainder of body 12 during reassembly of the heat spreader such that each of corresponding surface portions 18a, 18b, 18c of surface 18, the corresponding surface portions 20a, 20b, 20c of surface 20, the corresponding surface portions 22a, 22b, 22c of surface 22, the corresponding surface portions 24a, 24b, 24c of surface 24, the corresponding surface portions 26a, 26b, 26c of surface 26, the corresponding surface portions 28a, 28b, 28c of surface 28, and the corresponding surface portions 30a, 30b (not shown in FIGS. 1-2), 30c (not shown in FIGS. 1-2), of surface 30 are essentially in alignment with each other. That is, when reassembled, the conduction enhancements 16 are installed in corresponding features 14 of the remaining attachment material 17, then the attachment material is used to completely fill features 14 and 36 surrounding conduction enhancement 16, and then replace removed portion 32. Lastly, the heat spreader is machined to its final surfaces 18, 20, 22, 24, 26, 28, 30.

Attachment material 17 replaces body material volume that was removed to install a conduction enhancement 16. Typical attachment materials 16 include, but are not limited to, epoxy, solder, etc. In one embodiment, body 12 is a metal or other suitable material having a conduction value of between 20 W/m K and 500 W/m K for metals and an EMI interference shield value which can approach, but not exceed, the value of the constituent material—from body 12 or attachment material 17—with the highest shielding values for a structure of the same dimensions (thickness) and same application wherein the item has been fabricated solely of the specified material. Conduction enhancement 16 such as a heat pipe, vapor chamber and inserts such as diamond and pyrolytic graphite have a conduction value of between 1,000 and 250,000 W/m K that is greater than the conduction value of body 12

Figure 3:
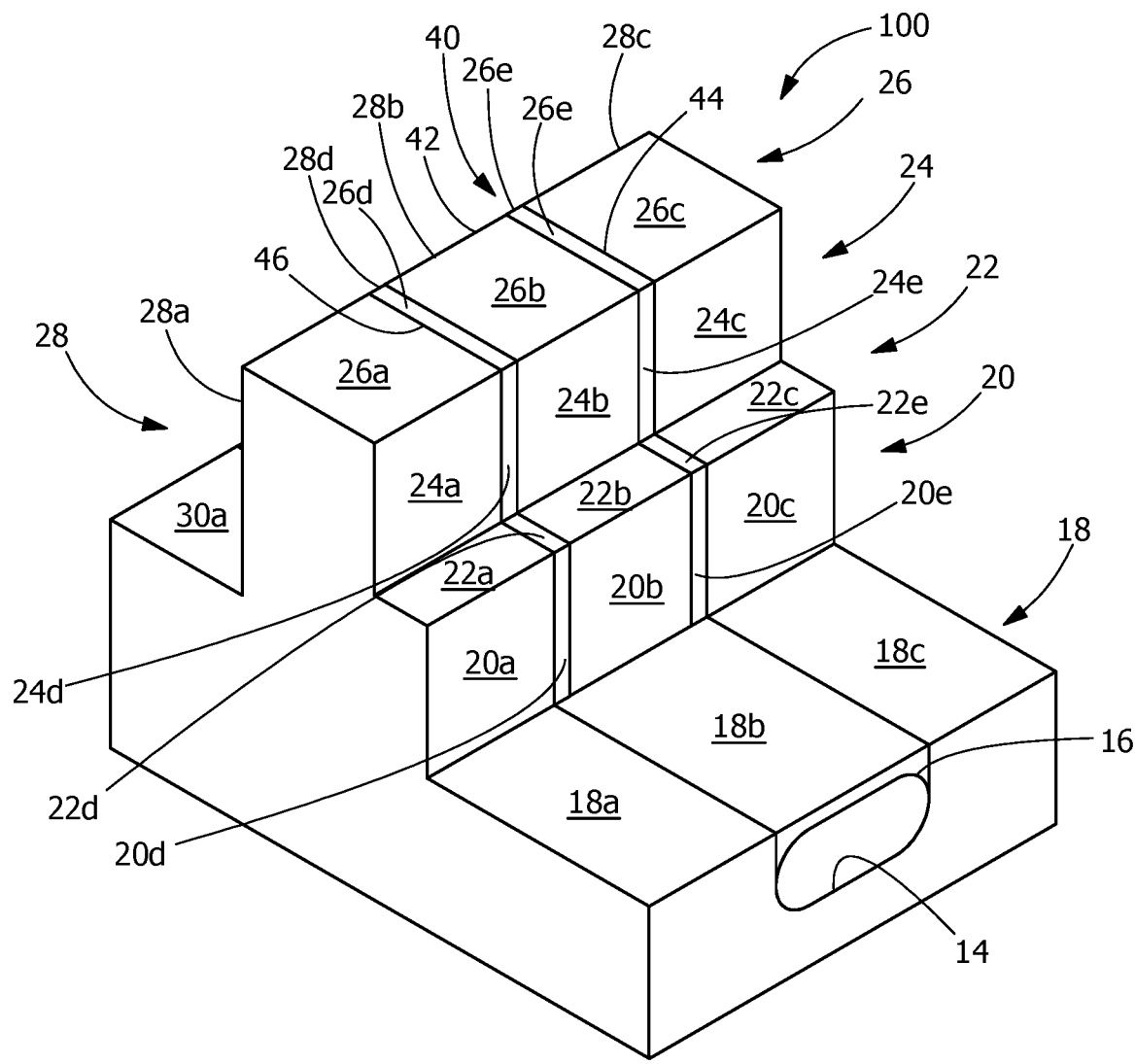
FIG. 3 is an upper perspective view of an exemplary heat spreader.
Figure 4:
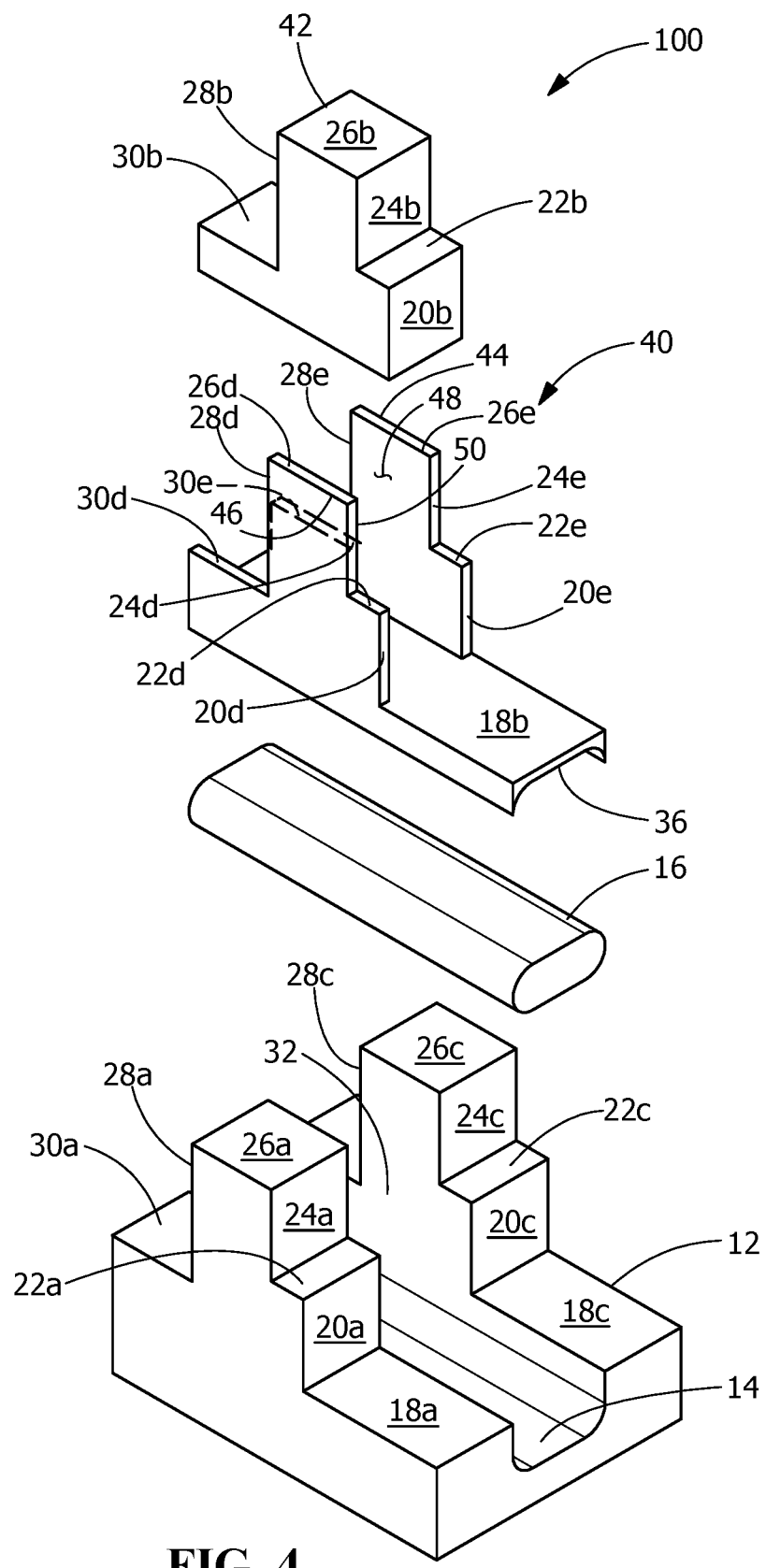
FIG. 4 is an exploded view of the heat spreader of FIG. 3.

Another exemplary heat spreader is shown collectively in FIGS. 3-4 and is directed to a heat spreader 100 that is generally similar to heat spreader 10, except as shown and discussed. As shown, heat spreader 100 includes outwardly facing surfaces 18, 20, 22, 24, 26, 28, 30 that are machined after assembly such that the corresponding surface portions 18a, 18b, 18c of surface 18, the corresponding surface portions 20a, 20b, 20c, 20d, 20e of surface 20, the corresponding surface portions 22a, 22b, 22c, 22d, 22e of surface 22, the corresponding surface portions 24a, 24b, 24c, 24d, 24e of surface 24, the corresponding surface portions 26a, 26b, 26c, 26d, 26e of surface 26, the corresponding surface portions 28a, 28b, 28c, 28d, 28e of surface 28, and the corresponding surface portions 30a, 30b (not shown in FIGS. 3-4), 30c (not shown in FIGS. 3-4), 30d, 30e of surface 30 precisely match the surrounding features of one another.

In order to manufacture heat spreader 100, it is necessary to first determine the routing or path of the conduction enhancements 16 (only one conduction enhancement 16 is shown in FIGS. 3-4), which may be achieved by finite element analysis software as is known. Next, features 14 (one feature 14 is shown in FIG. 3) such as grooves or channels are formed in body 12 such as by machining or removing a portion of body 12 to receive a corresponding conduction enhancement 16 therein. That is, as shown in FIGS. 3-4, the amount or volume of material removed from a solid block of body 12 having surfaces 18, 20, 22, 24, 26, 28, 30 entails removing the sum of the volume of body 12 corresponding to what are portions 44, 46 that are vertically above a plane defined by surface portion 18b of an attachment material 40 (when added back to body 12 for reassembly), the volume of an insert or body 42, such as composed of copper, aluminum, magnesium, beryllium, other metal or other suitable material such as metal matrix composites such as molybdenum-copper, tungsten-copper, aluminum-silicone carbide, beryllium-copper, or other suitable combinations of composites with various constituents and composition values as well as the volume corresponding to feature 14, which sum of removed material from body 12 being referred to as a portion or removed portion 32 of body 12. In this embodiment, the removed portion 32 of body 12 is not reused, and in its place, body 42 and attachment material 40 are used to help construct the heat spreader. That is, body 42 comprises the volume of attachment material 40 displaced between a plane defined by surface portion 18b, a plane defined by surface portions 22d, 22e, a plane defined by surface portions 24d, 24e, a plane defined by surface portions 26d, 26e, a plane defined by surface portions 28d, 28e, a plane defined by surface portions 30d, 30e, a surface 48 of portion 44, and a surface 50 of portion 46. The volume corresponding to feature 36 is subtracted from the volume of attachment material 40. The volume of feature 36 must be removed from attachment material 40 in order to receive conduction enhancement 16 between attachment material 40, body 42 and the remainder of body 12 during reassembly of the heat spreader such that each of the corresponding surface portions 18a, 18b, 18c of surface 18, the corresponding surface portions 20a, 20b, 20c, 20d, 20e of surface 20, the corresponding surface portions 22a, 22b, 22c, 22d, 22e of surface 22, the corresponding surface portions 24a, 24b, 24c, 24d, 24e of surface 24, the corresponding surface portions 26a, 26b, 26c, 26d, 26e of surface 26, the corresponding surface portions 28a, 28b, 28c, 28d, 28e of surface 28, and the corresponding surface portions 30a, 30b (not shown in FIGS. 3-4), 30c (not shown in FIGS. 3-4), 30d, 30e of surface 30 are essentially in alignment with each other.

That is, when reassembled, the conduction enhancements 16 are installed in corresponding features 14 of the remaining body 12, using the attachment material 40 to completely fill features 14, 36 and any incidental gaps between body 42 and the removed portion 32 of body 12. Lastly, the heat spreader 100 is machined to its final surfaces 18, 20, 22, 24, 26, 28, 30.

In one embodiment, a volume or subportion 34 (FIG. 2) of removed portion 32 of body 12 is retained and reused to construct the heat spreader instead of body 42 (FIG. 4).

The above novel arrangement provides several benefits, including:
1. conduction enhancement 16 improves heat spreading;
2. attachment material 17, 40 replaces body 12 material, typically metal, for maintaining EMI shielding; and
3. attachment material 17, 40 replaces body 12 material, typically metal, for heat transfer path;

Furthermore, the novel arrangement having attachment material 17, 40 for use with an insert or body 42 provides additional benefits, including:
1conduction enhancement 16 improves heat spreading;
2. attachment material 17, 40 replaces body 12 material, typically metal, for EMI shielding;
3. attachment material 17, 40 replaces body 12 material, typically metal, for heat transfer path;
4. body 42 can have higher electrical conductivity than attachment material 17, 40, offering better EMI shielding than the attachment material; and
5. body 42 can have higher thermal conductivity than attachment material 17, 40, offering a better heat transfer path than the attachment material.

Attachment material 17 (FIG. 1), 40 (FIG. 3) with body 42 (FIG. 3) is typically used in heat spreader applications where the heat spreader must be machined to final dimensions in one step. An example is a HiK™ plate requiring an electroless nickel coating for corrosion resistance. The HiK™ plate is machined in one step to final dimensions with the conduction enhancement features such as grooves and EMI boundary section machining included. An insert or body 42 (FIG. 3) is machined to match the material volume removed from the EMI boundary. The plate, as well as the insert piece, are electroless nickel plated to the required specification. The conduction enhancements and insert piece are installed using the attachment material to completely fill the features or grooves, and any open space between the insert piece and conduction enhancements or plate. The final product is a complete HiK™ plate with conduction enhancements installed, and an electroless nickel coating on all exterior aluminum surfaces that are exposed to the environment. The areas with exposed attachment material would not receive an electroless nickel coating; however, they could receive a chemical conversion coating for added protection against corrosion.

EXAMPLE 1

Figure 5:
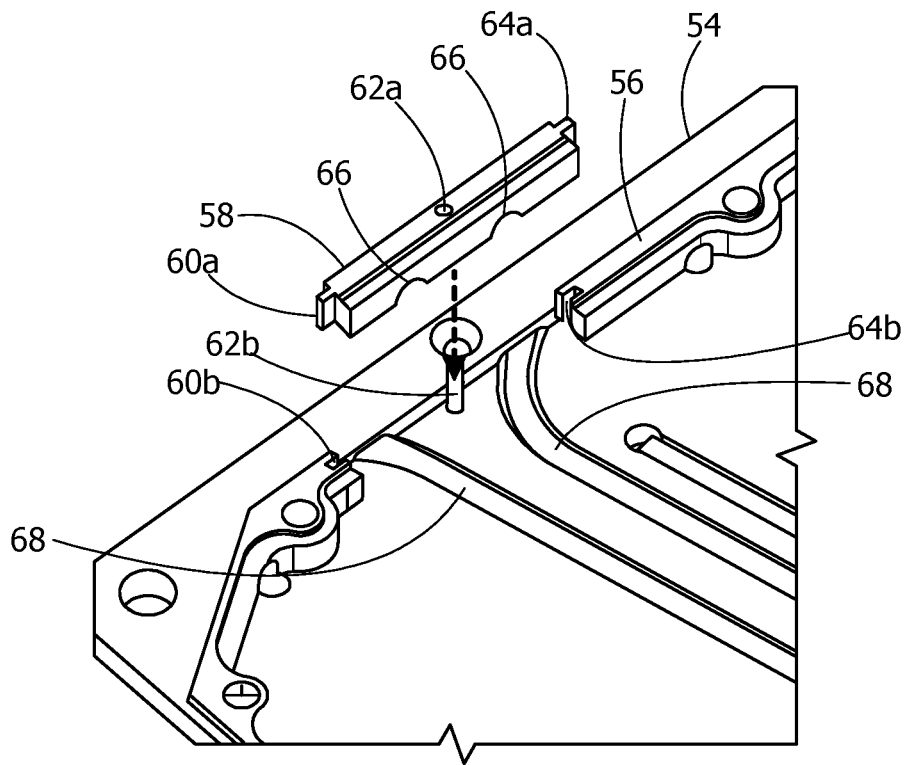
FIG. 5 is a partial upper perspective exploded view of an exemplary heat spreader.
Figure 6:
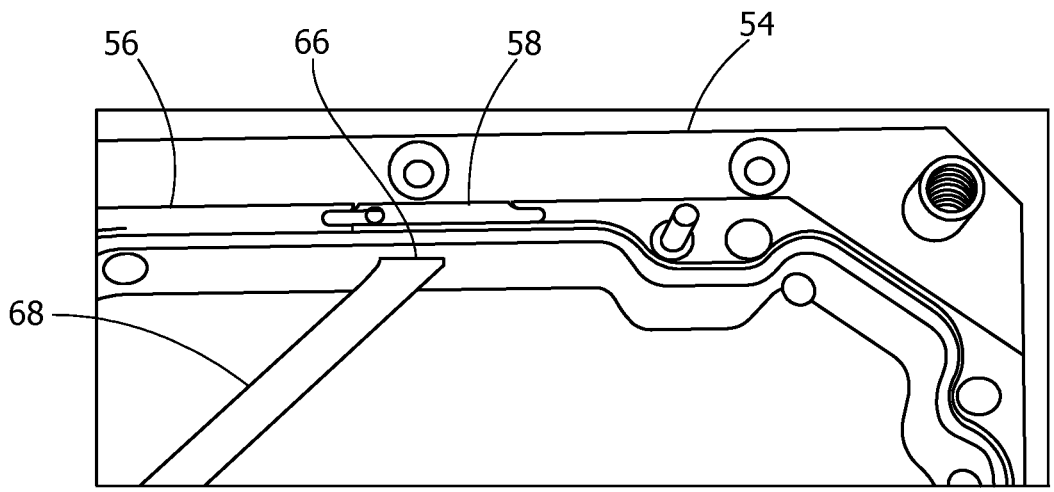
FIG. 6 is a partial upper perspective view of an assembled heat spreader similar to the heat spreader of FIG. 5.

As shown in FIGS. 5-6, an exemplary heat spreader was a conduction card 54 having EMI shielding features 56, which included a removable EMI shielding portion 58 removably securable to EMI shielding features 56 by removable fasteners 60a, 60b, 62a, 62b, 64a, 64b. EMI shielding portion 58 included a pair of clearance features 66 for providing clearance over conduction enhancements 68 such as heat pipes. This arrangement permitted accommodating an optimum positioning of conduction enhancements 68, while also providing EMI shielding. Moreover, the conduction card 54 was usable as a drop-in replacement, while supporting high performance electronics.

EXAMPLE 2

Figure 7:
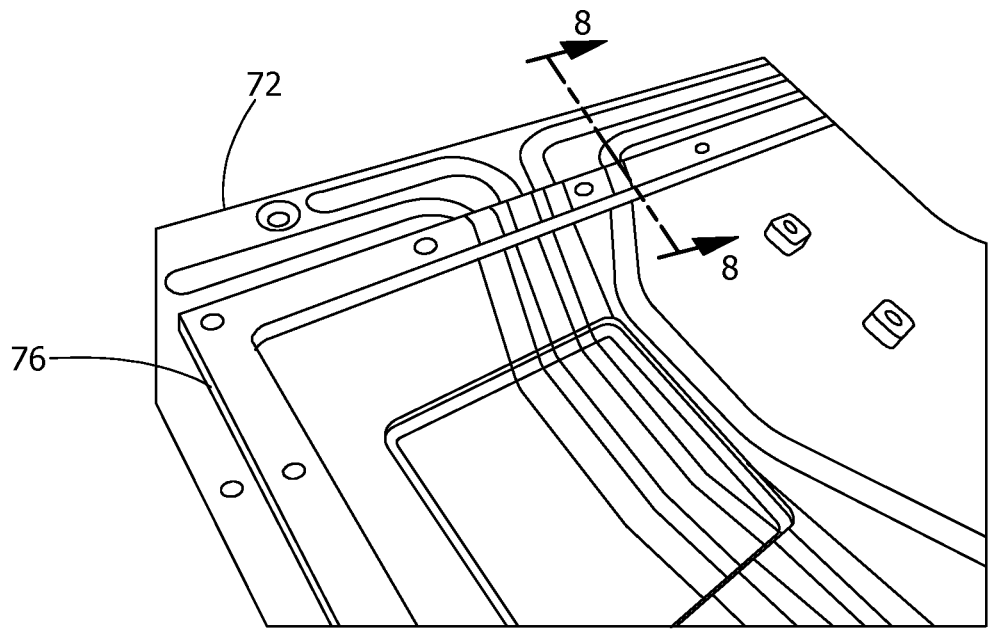
FIG. 7 is a partial upper perspective view of an exemplary heat spreader.
Figure 8:
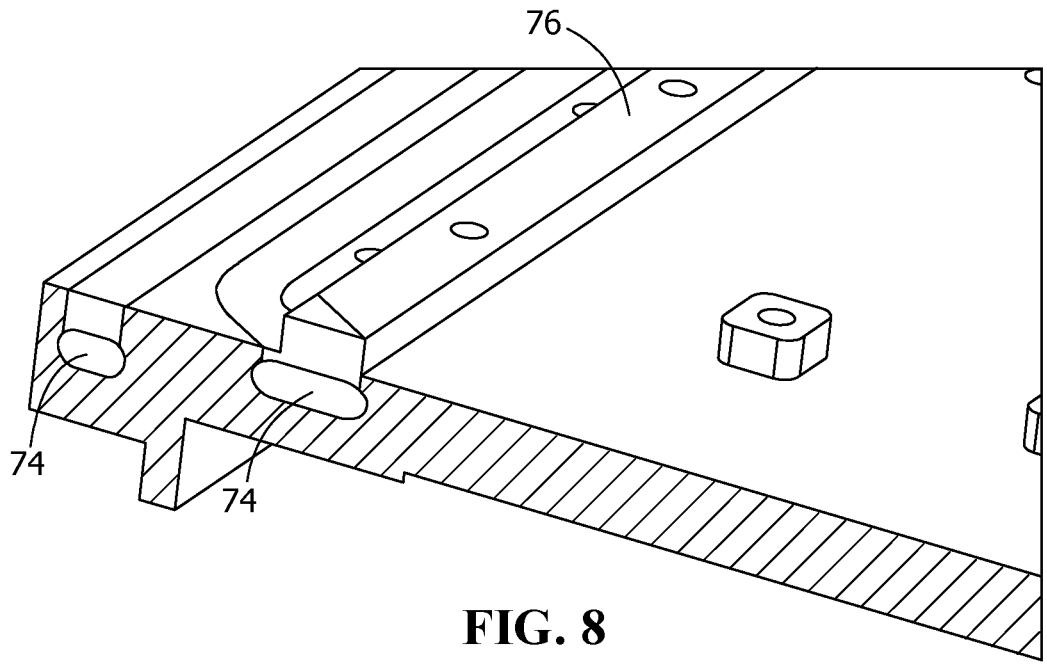
FIG. 8 is a partial upper perspective view including a cross section taken along line 8-8 of the heat spreader of FIG. 7.
Figure 9:
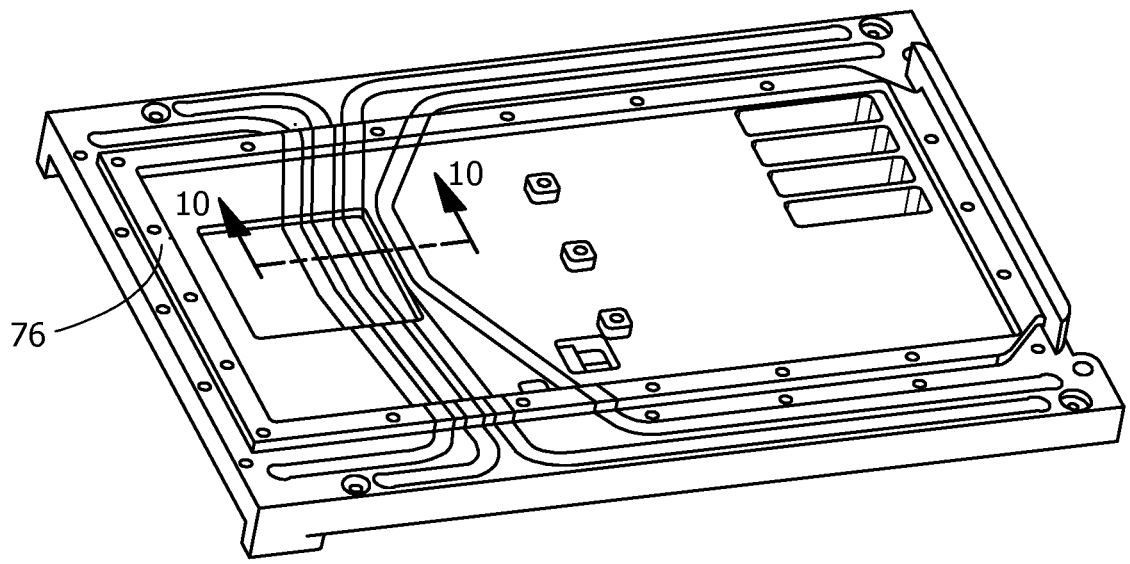
FIG. 9 is an upper perspective view of an exemplary heat spreader.
Figure 10:
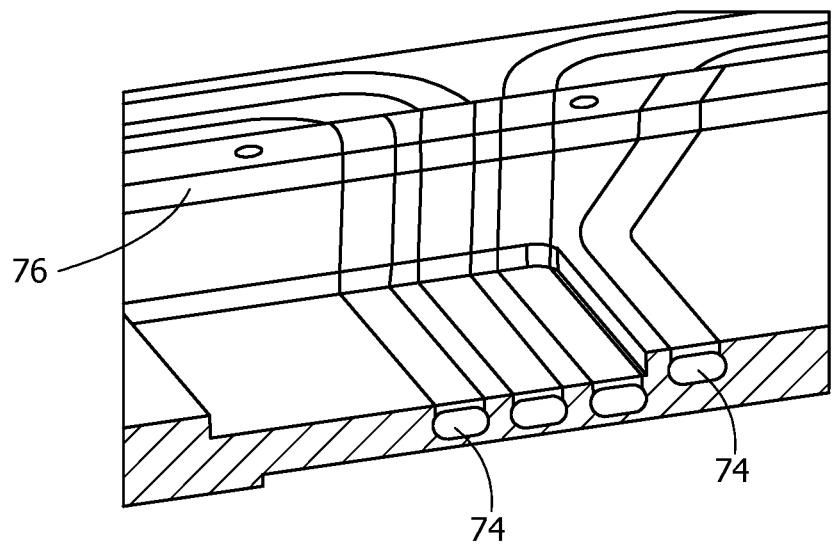
FIG. 10 is an enlarged, partial upper perspective view including a cross section taken along line 10-10 of the heat spreader of FIG. 9.

As collectively shown in FIGS. 7-10, an exemplary heat spreader was also usable as a drop-in replacement, while supporting high performance electronics. FIG. 8 is a partial upper perspective view including a cross section taken along line 8-8 of the heat spreader of FIG. 7, and FIG. 10 is an enlarged, partial upper perspective view including a cross section taken along line 10-10 of the heat spreader of FIG. 9. A conduction card 72 included conduction enhancement 74 (FIG. 8) using heat pipes to provide superior thermal performance. The initial design restricted the heat pipe routing within the EMI shielded boundary 76. The boundary was a Form-In-Place (FIP) gasket, commonly used for EMI shielding, installed around the perimeter of the conduction card with rails on the exterior of the EMI shielded boundary 76 for heat transfer to the condenser. The present invention allowed for heat pipes to be routed from inside the EMI shielded boundary 76, where the heat loads were applied, to the condenser rail for increased thermal performance, while filling back in the features needed to install the FIP gasket to ensure no EMI leak would occur.

It is to be understood that the various descriptions of the embodiments disclosed herein have been simplified to illustrate only those elements, features, and aspects that are relevant to a clear understanding of the disclosed embodiments, while eliminating, for purposes of clarity, other elements, features, and aspects. Persons having ordinary skill in the art, upon considering the present description of the disclosed embodiments, will recognize that other elements and/or features may be desirable in a particular implementation or application of the disclosed embodiments. However, because such other elements and/or features may be readily ascertained and implemented by persons having ordinary skill in the art upon considering the present description of the disclosed embodiments, and are therefore not necessary for a complete understanding of the disclosed embodiments, a description of such elements and/or features is not provided herein. As such, it is to be understood that the description set forth herein is merely exemplary and illustrative of the disclosed embodiments and is not intended to limit the scope of the invention as defined solely by the claims.

In the present disclosure, other than where otherwise indicated, all numbers expressing quantities or characteristics are to be understood as being prefaced and modified in all instances by the term "about." Accordingly, unless indicated to the contrary, any numerical parameters set forth in the following description may vary depending on the desired properties one seeks to obtain in the embodiments according to the present disclosure. At the very least, and not as an attempt to limit the application of the doctrine of equivalents to the scope of the claims, each numerical parameter described in the present description should at least be construed in light of the number of reported significant digits and by applying ordinary rounding techniques.

Also, any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10. Any maximum numerical limitation recited herein is intended to include all lower numerical limitations subsumed therein and any minimum numerical limitation recited herein is intended to include all higher numerical limitations subsumed therein. Accordingly, Applicant reserves the right to amend the present disclosure, including the claims, to expressly recite any sub-range subsumed within the ranges expressly recited herein. All such ranges are intended to be inherently disclosed herein such that amending to expressly recite any such sub-ranges would comply with the requirements of 35 U.S.C. .sctn.112, first paragraph, and 35 U.S.C. .sctn.132(a).

The grammatical articles "one," "a," "an," and "the," as used herein, are intended to include "at least one" or "one or more," unless otherwise indicated. Thus, the articles are used herein to refer to one or more than one (i.e., to at least one) of the grammatical objects of the article. By way of example, "a component" means one or more components, and thus, possibly, more than one component is contemplated and may be employed or used in an implementation of the described embodiments.

Any patent, publication, or other disclosure material, in whole or in part, that is said to be incorporated by reference herein, is incorporated herein in its entirety, but only to the extent that the incorporated material does not conflict with existing definitions, statements, or other disclosure material expressly set forth in this disclosure. As such, and to the extent necessary, the express disclosure as set forth herein supersedes any conflicting material incorporated herein by reference. Any material, or portion thereof, that is said to be incorporated by reference herein, but which conflicts with existing definitions, statements, or other disclosure material set forth herein is only incorporated to the extent that no conflict arises between that incorporated material and the existing disclosure material.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A heat spreader, comprising:
   a body having a first end portion and a second end portion opposite the first end portion, the body includes a first conduction value and a first electromagnetic interference shield value; and
   a conduction enhancement affixed to the body, the conduction enhancement having a second conduction value greater than the first conduction value and a second electromagnetic interference shield value less than the first electromagnetic interference shield value;
   wherein a portion of the body is removed to at least partially receive the conduction enhancement;
   wherein a subportion of the removed body portion is affixed to the body within a groove and on top of the conduction enhancement such that an upper surface of the subportion is flush with an upper surface of the body; and
   wherein the conduction enhancement is positioned in direct contact with the body within the groove and extends from the first end portion to the second end portion of the body for increasing an effective electromagnetic interference shield value of the body associated with the conduction enhancement.

2. The heat spreader of claim 1, wherein a second body is affixed to the body, the conduction enhancement, or both the body and the conduction enhancement to at least partially be adjacent to, exterior of, obscure, extend over, or a combination thereof of at least a portion of the conduction enhancement.

3. A heat spreader, comprising:
   a first body having a first end portion and a second end portion opposite the first end portion, the first body includes a first conduction value and a first electromagnetic interference shield value; and
   a conduction enhancement having a second conduction value greater than the first conduction value and a second electromagnetic interference shield value less than the first electromagnetic interference shield value;
   wherein a portion of the first body is removed providing a first groove to at least partially receive the conduction enhancement;
   wherein a subportion of the removed body portion is affixed to the first body the first groove and on top of the conduction enhancement such that an upper surface of the subportion is flush with an upper surface of the first body;
   wherein the conduction enhancement is positioned in direct contact with the first body within the first groove and extends from the first end portion to the second end portion of the first body; and
   wherein a second body has a third conduction value greater than the first conduction value and a third electromagnetic interference shield value less than the first electromagnetic interference shield value, and the second body is positioned within a second groove formed in the subportion such that an upper portion of the second body is flush with the upper surface of the subportion and the upper surface of the first body.

4. A method for constructing a heat spreader, comprising:
   providing a body having a first end portion and a second end portion opposite the first end portion, the body includes a first conduction value and a first electromagnetic interference shield value;
   providing a conduction enhancement having a second conduction value greater than the first conduction value and a second electromagnetic interference shield value less than the first electromagnetic interference shield value; and
   positioning the conduction enhancement from the first end portion to the second end portion within the body for increasing an effective electromagnetic interference shield value of the body associated with the conduction enhancement,
   wherein prior to positioning at least a portion of the conduction enhancement,
   removing a portion of the body to at least partially receive the conduction enhancement; and
      subsequent to positioning at least a portion of the conduction enhancement, affixing a subportion of the removed body portion to at least partially be adjacent to, exterior of, obscure, extend over, or a combination thereof of the at least a portion of the conduction enhancement.

5. The method of claim 4 further comprising prior to positioning at least a portion of the conduction enhancement,
   removing a portion of the body to at least partially receive the conduction enhancement; and
   subsequent to positioning at least a portion of the conduction enhancement,
   affixing a second body to at least partially be adjacent to, exterior of, obscure, extend over, or a combination thereof of the at least a portion of the conduction enhancement, the second body having a third conduction value greater than the first conduction value and a third electromagnetic interference shield value less than the first electromagnetic interference shield value.

6. The heat spreader of claim 1, wherein the first conduction value is between 20 W/m K and 500 W/m K.

7. The heat spreader of claim 1, wherein the second conduction value is between 1,000 W/m K and 250,000 W/m K.

8. The heat spreader of claim 1, wherein the body is composed of copper, aluminum, magnesium, beryllium, molybdenum-copper, tungsten-copper, aluminum-silicone carbide, beryllium-copper, or combination thereof.

9. The heat spreader of claim 1, wherein the conduction enhancement is a heat pipe, vapor chamber, diamond, or pyrolytic graphite.

10. The heat spreader of claim 3, wherein the first conduction value is between 20 W/m K and 500 W/m K.

11. The heat spreader of claim 3, wherein the second conduction value is between 1,000 W/m K and 250,000 W/m K.

12. The heat spreader of claim 3, wherein the body is composed of copper, aluminum, magnesium, beryllium, molybdenum-copper, tungsten-copper, aluminum-silicone carbide, beryllium-copper, or combination thereof.

13. The heat spreader of claim 3, wherein the conduction enhancement is a heat pipe, vapor chamber, diamond, or pyrolytic graphite.

14. The method of claim 4, wherein the first conduction value is between 20 W/m K and 500 W/m K.

15. The method of claim 4, wherein the second conduction value is between 1,000 W/m K and 250,000 W/m K.

16. The method of claim 4, wherein the body is composed of copper, aluminum, magnesium, beryllium, molybdenum-copper, tungsten-copper, aluminum-silicon-carbide, beryllium-copper, or combination thereof.

* * * * *